United States Patent
Nakamura

[11] Patent Number: 5,929,714
[45] Date of Patent: *Jul. 27, 1999

[54] PLL TIMING GENERATOR

[75] Inventor: Kazuyuki Nakamura, Tokyo, Japan

[73] Assignee: NEC Corporation, Tokyo, Japan

[*] Notice: This patent is subject to a terminal disclaimer.

[21] Appl. No.: 08/799,262

[22] Filed: Feb. 13, 1997

Related U.S. Application Data

[62] Division of application No. 08/390,222, Feb. 16, 1995, Pat. No. 5,619,170.

[30] Foreign Application Priority Data

Apr. 19, 1994 [JP] Japan .................................. 6-79085

[51] Int. Cl.$^6$ ............................. H03K 3/017; H03K 5/04
[52] U.S. Cl. .............................. 331/57; 331/1 A; 331/74; 327/156; 327/159; 327/161
[58] Field of Search ..................... 331/1 A, 57, 74; 327/156, 158, 291, 159, 161, 175

[56] References Cited

U.S. PATENT DOCUMENTS

| | | | |
|---|---|---|---|
| 4,061,975 | 12/1977 | Sugai | 327/172 |
| 4,713,621 | 12/1987 | Nakamura et al. | 327/298 X |
| 4,797,585 | 1/1989 | Segawa et al. | 327/172 |
| 5,018,169 | 5/1991 | Wong et al. | 327/291 X |
| 5,179,294 | 1/1993 | Bechade et al. | 327/172 |
| 5,264,737 | 11/1993 | Oikawa | 327/172 |
| 5,331,295 | 7/1994 | Jelinek et al. | 331/57 |
| 5,448,205 | 9/1995 | Rothemel | 331/57 |
| 5,451,911 | 9/1995 | Colvin et al. | 331/57 |
| 5,619,170 | 4/1997 | Nakamura | 331/14 |

FOREIGN PATENT DOCUMENTS

| | | |
|---|---|---|
| 3-73554 | 3/1991 | Japan . |
| 93-92504 | 2/1993 | WIPO . |

OTHER PUBLICATIONS

Afzal, "Three–Phase Clock From Reference Clock Using TTL", Electronic Engineering, Jun. 1979, vol. 51, No. 624, p. 35.

Rogers et al., "Delay Line Applications", IBM Tech. Disc., Jun. 1962, vol. 5, No. 1.

*Primary Examiner*—Arnold Kinkead
*Attorney, Agent, or Firm*—Foley & Lardner

[57] ABSTRACT

A phase lock loop timing generator including a voltage controlled oscillator as a current-limited ring oscillator composed of multistage inverters connected in series in a ring form using a phase lock loop. From nodes of the inverters, $\phi 0$ to $\phi 8$ signals are obtained and an AND or OR of the signals are calculated to generate an internal timing. The obtained timing pulse is defined by % of a clock cycle of a reference clock signal and thus a timing depending on an external cycle can be set. Further, a timing prior to the clock edge of the reference clock signal can be generated and by using this timing, an effective current cut of an input buffer can be performed. Hence, a timing generation proportional to the external clock cycle without being affected by a production process or the like to enable us to provide a flexible timing designing.

6 Claims, 6 Drawing Sheets

F I G. 11
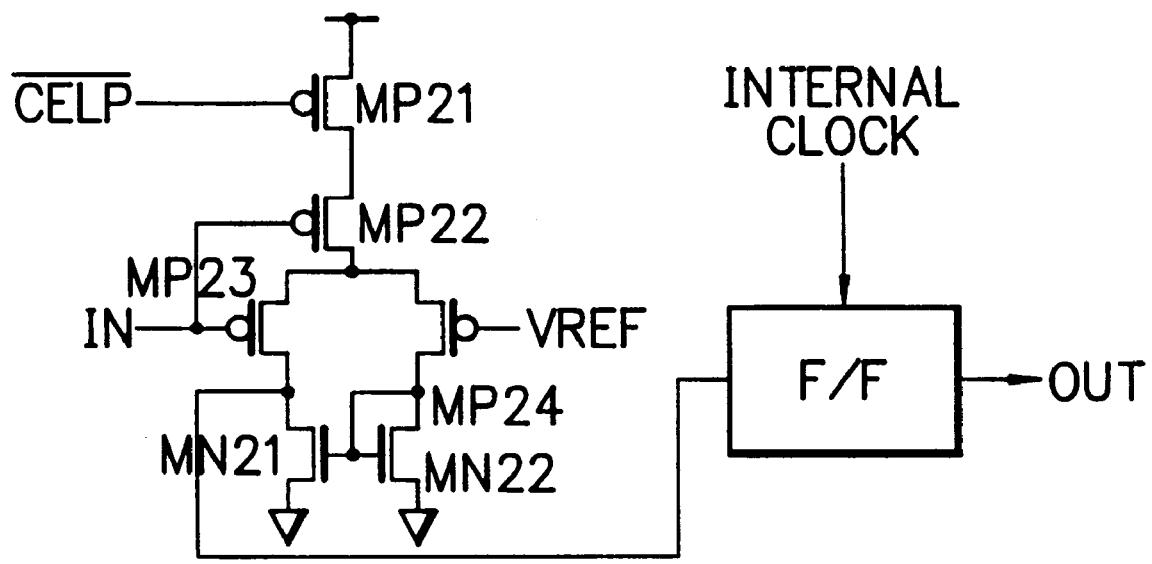

PLL TIMING GENERATOR

This application is a division of application Ser. No. 08/390,222, filed Feb. 16, 1995 now U.S. Pat. No. 5,619,170.

BACKGROUND OF THE INVENTION

The present invention relates to a phase lock loop timing generator in semiconductor large scale integrated circuits (LSIs) or intergrated circuits (ICs).

DESCRIPTION OF THE RELATED ARTS

A conventional timing generator in an LSI generates a clock pulse delayed by a certain time with respect to a reference clock signal (a leading or trailing edge of an external clock signal) or a clock pulse having a certain pulse width, as shown in FIG. 1. Hence, as shown in FIG. 1, even if its clock cycle Tcyc varies, the delay time Td of the clock pulse CP1 and its pulse width Tw become constant. FIGS. 2 and 3 illustrate conventional timing generators to output respective timing pulses PUL1 and PUL2. FIG. 4 shows the waveforms of the timing pulses PUL1 and PUL2. In FIG. 4, the pulse width of the timing pulse PUL1 and the delay time from the clock edge of the timing pulse PUL2 are determined depending on delay times Td1 and Td2 of delay circuits in the timing generators.

In these conventional systems, all timings are determined at their design time and these timings are constant even when the clock cycle of the external clock signal as the reference clock signal is changed. Hence, a delicate timing mismatch leads to a faulty operation of the LSI and a normal operation cannot be expected even when a low speed clock frequency is used. Further, in the conventional timing generating system, a variation of the delay time of the delay circuit due to a change of the producing process or the like is inevitable. Moreover, a timing prior to a reference clock edge (a leading timing of the external clock signal shown in FIG. 1) cannot be generated in theory.

SUMMARY OF THE INVENTION

Accordingly, it is an object of the present invention to provide a phase lock loop timing generator in view of the aforementioned problems of the prior art, which is capable of generating an internal timing clock proportional to an external clock cycle to permit a design of an internal timing within an LSI to be free from an influence of the production process or the like and to prevent the LSI from its defective operation due to a delicate timing mismatch.

In accordance with one aspect of the present invention, there is provided a phase lock loop timing generator, comprising a phase comparator for comparing an external clock signal with an internal clock signal to detect a phase difference; and an oscillator including a plurality of stages of inverters connected in series in a ring form, in which the frequency of the internal clock signal is varied depending on the phase difference detected by the phase comparator, wherein one of the AND and OR of signals picked up from nodes of the inverters is calculated to output a timing signal proportional to a cycle of the external clock signal synchronous with a phase lock loop.

A fixed delay circuit can be connected to an output of the nodes of the inverters for generating the timing signal to obtain a minimum time width of the timing signal.

Also, a logic can calculate either AND or OR of two signals picked up from nodes of the inverters, located in several stages either before or after the internal clock signal node, to output a timing for striding over a cyclic reference edge of the external clock signal. By using this phase lock loop timing generator, an amplifier is operated in only the period of the reference edge of the clock signal to reduce power consumption.

Further, buffers are connected to the nodes of the inverters so as to pick up the signals from the nodes via the buffers to equalize delay times of the inverters.

BRIEF DESCRIPTION OF THE DRAWINGS

The objects, features and advantages of the present invention will become more apparent from the consideration of the following detailed description, taken in conjunction with the accompanying drawings, in which:

FIG. 11 is a circuit diagram of an amplifier using the phase lock loop timing generator according to the present invention.

DESCRIPTION OF THE PREFERRED EMBODIMENTS

Figure 1:
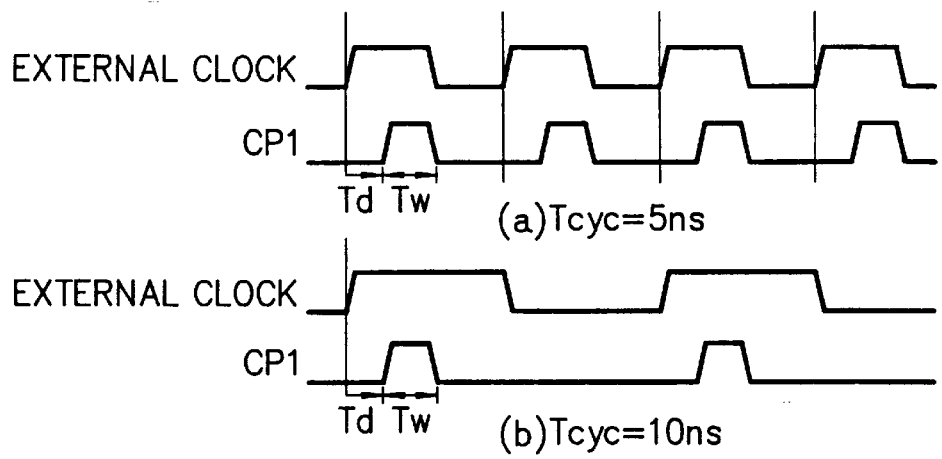
FIG. 1 is a timing chart showing timing pulses obtained by a conventional timing design.
Figure 2:
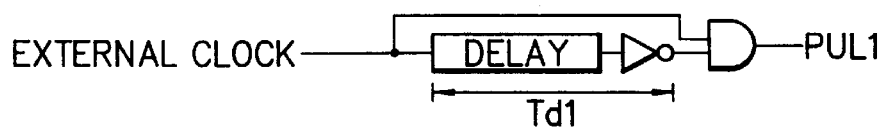
FIGS. 2 and 3 are circuit diagrams of conventional timing generators.
Figure 3:
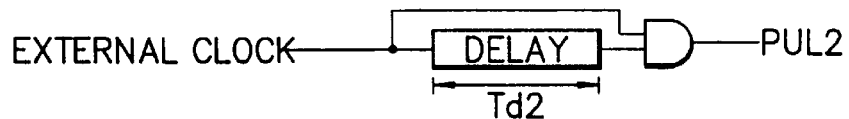
Figure 4:
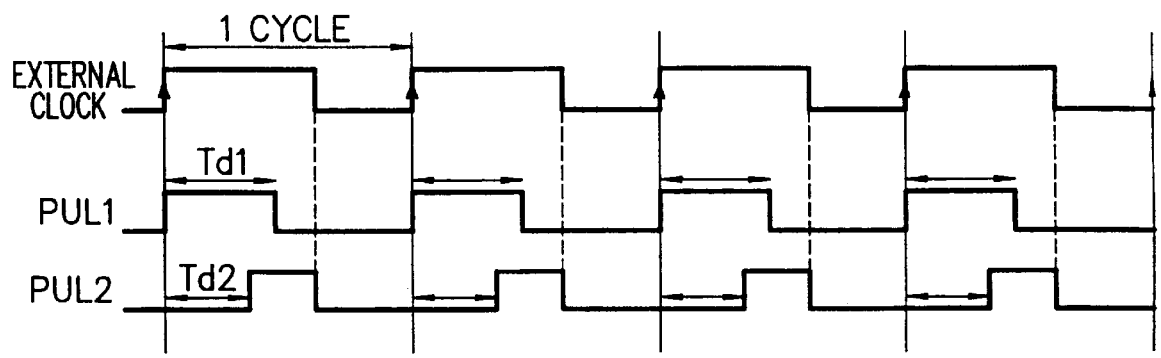
FIG. 4 is a timing chart showing timing pulses generated by the timing generators shown in FIGS. 2 and 3.

The present invention will now be described in connection with its preferred embodiments with reference to the accompanying drawings, wherein like reference characters designate like or corresponding parts throughout the views and the thus the repeated description thereof can be omitted for brevity.

Figure 8:
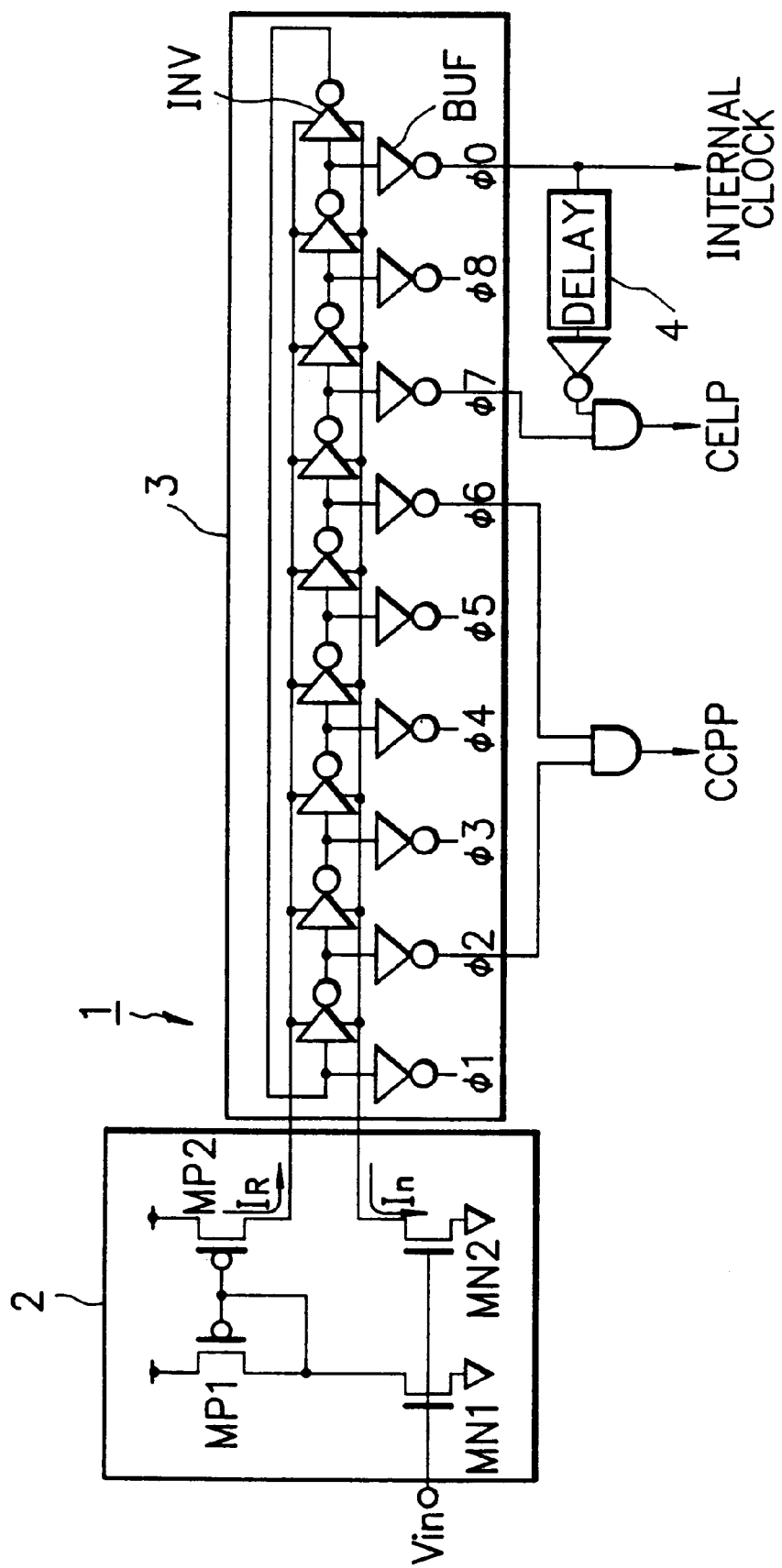
FIG. 8 is a circuit diagram of a voltage-controlled oscillator to be used for a phase lock loop timing generator according to the present invention.
Figure 9:
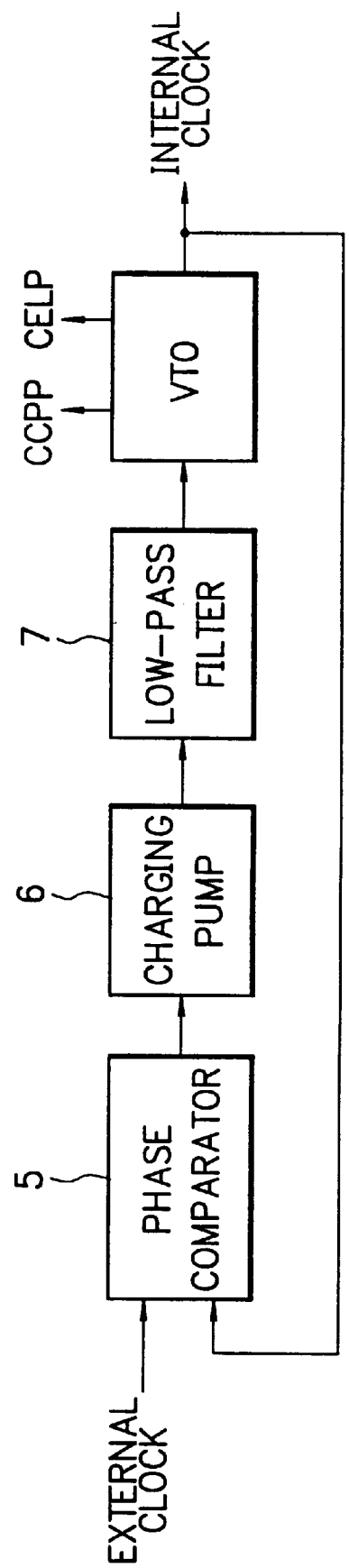
FIG. 9 is a circuit diagram of a phase lock loop timing generator including the voltage controlled oscillator shown in FIG. 8 according to the present invention.

FIG. 8, illustrates a voltage controlled oscillator (VCO) and FIG. 9 shows a phase lock loop timing generator including the voltage controlled oscillator shown in FIG. 8 according to the present invention. As shown in FIG. 8, the voltage controlled oscillator 1 includes a voltage-current converter 2 and a current-limited ring oscillator 3. In FIG. 8, in the voltage-current converter 2, a variation of an input voltage Vin is converted into control currents IR and In which are used as power currents of the current-limited ring oscillator 3 which is composed of a plurality of inverters of multistage, connected in series in a ring form. In this multistage ring oscillator, phase-shifted signals output from nodes of the multistage inverters are logically calculated, such as AND or OR, to produce timing pulses proportional to the clock cycle, thereby producing clock cycle proportional pulses (CCPP). In FIG. 8, the signals are picked up from the nodes of the inverters connected in the ring form via buffers (BUFs) (inverters in FIG. 8). The buffers make the loads of the ring form inverters uniform and function to equalize the delay times. In this embodiment, the signal picked up from the node of the inverters via the buffer is passed through a delay circuit 4 having a fixed delay time to obtain the minimum pulse width of the timing signal (clock edge lookahead pulse=CELP). Further, by using the signal of the previous stage such as the seventh ($\phi7$) stage from the node of the ninth ($\phi0$) stage, from which an internal clock signal is output, a timing prior to a reference clock edge can be generated (the CELP).

Figure 5:
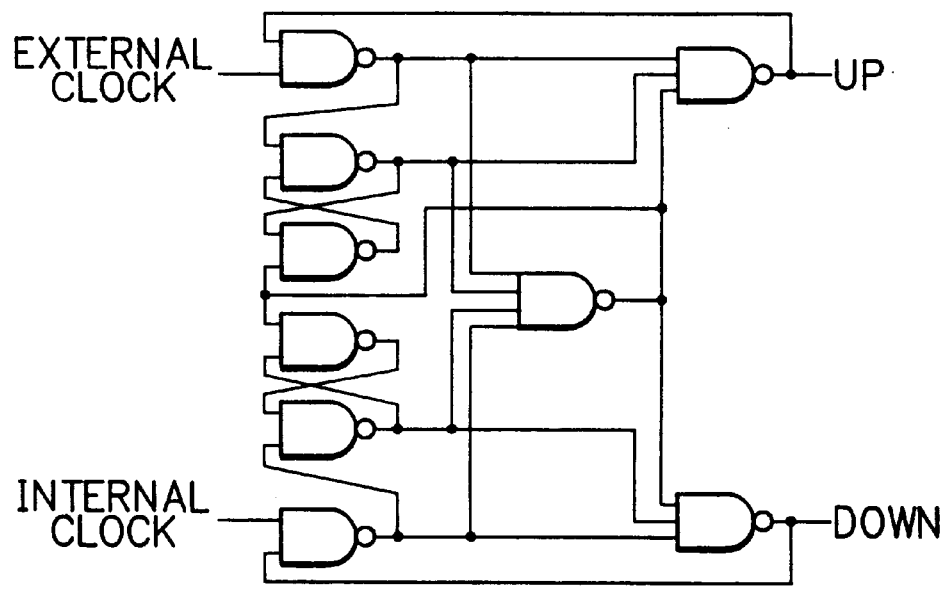
FIG. 5 is a circuit diagram of a typical conventional phase comparator to be used in a phase lock loop timing generator according to the present invention.
Figure 6:
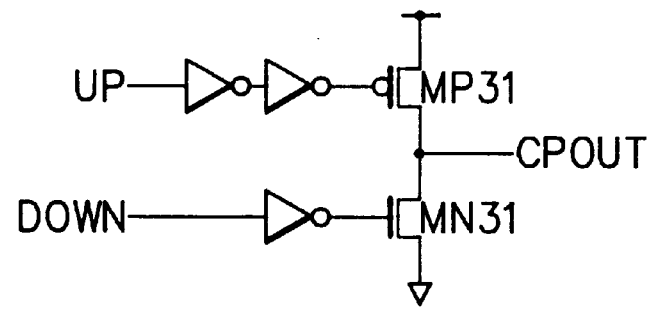
FIG. 6 is a circuit diagram of a typical conventional charging pump to be used in the phase lock loop timing generator according to the present invention.
Figure 7:
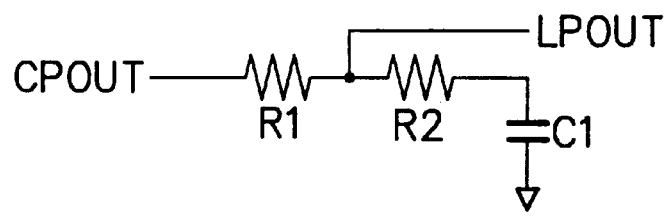
FIG. 7 is a circuit diagram of a typical conventional low-pass filter to be used in the phase lock loop timing generator according to the present invention.

The phase lock loop timing generator, as shown in FIG. 9, comprises a phase comparator 5, a charging pump 6, a low-pass filter 7 and the voltage controlled oscillator 1 shown in FIG. 8. The phase comparator 5, the charging pump 6 and the low-pass filter 7 detect a phase difference between an external clock signal and the internal clock signal and from this phase difference, the input voltage Vin for the voltage controlled oscillator 1 is produced. In this embodiment, a typical conventional phase comparator, a typical conventional charging pump and a typical low-pass filter shown in FIGS. 5, 6 and 7, respectively, can be used. The phase lock loop timing generator of the present invention is characterized by using the voltage controlled oscillator 1 shown in FIG. 8.

Figure 10:
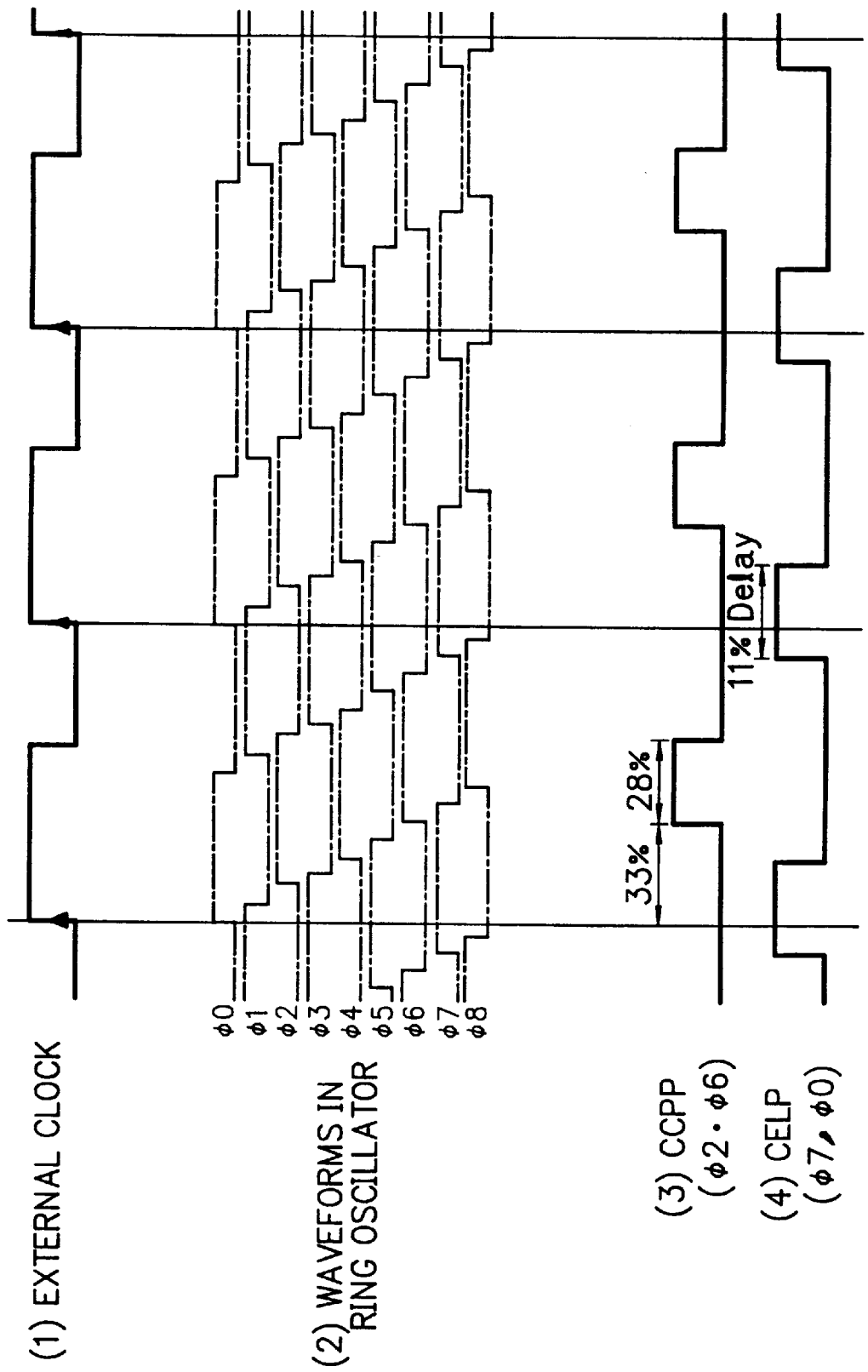
FIG. 10 is a timing chart showing timing pulses generated by the voltage controlled oscillator shown in FIG. 8.

FIG. 10 illustrates timing signals generated by the voltage controlled oscillator 1 shown in FIG. 8. While the internal clock signal is synchronized with the external clock signal (a waveform (1) in FIG. 10) by the operation of the phase lock loop timing generator, the signals ($\phi0$ to $\phi8$) picked up from the internal nodes of the inverters in the current-limited ring oscillator 3 have the same cycle as that of the external clock signal, as shown by waveforms (2) in the ring oscillator 3 in FIG. 10, but their phases are shifted from one another at an equal interval. These phase shifts become a value obtained by dividing one clock cycle by twice of the stage number of the inverters connected in the ring form when the leading and trailing delay times of the inverters connected in the ring form are designed so as to become equal by using the leading and trailing edges of each signal. For example, in the circuit shown in FIG. 8, the stage number of the inverters is nine and thus the delay time from the leading edge of $\phi0$ to the trailing edge of $\phi1$ is calculated to be just $1/18$ (approximately 5.6%) of the external clock cycle. Hence, by using two signals having different phases of these $\phi0$ to $\phi6$, for example, an AND of two signals of $\phi6$ and $\phi2$ is calculated, as shown by a waveform (3) of the CCPP signal in FIG. 10, a timing pulse which is leading with a delay of approximately 33% of the clock cycle and has a pulse width of approximately 28% of the clock cycle can be obtained. Since the timing of this pulse can be determined depending on only the clock cycle, this pulse cannot be affected by performance dispersion of the transistors, the change of the production process and the like.

Furthermore, even if the timing is designed with a small operation margin for intending to obtain the maximum operation speed, a slowdown of the operation cycle permits all timing margins to be lightened, and, even though a high speed operation cannot be expected, the LSIs operable at a low speed can be saved and used without requiring any technique such as trimming or the like. In the present system, when a fine adjustment of the timing is required, apparently, it can be possible to shift the signal pickup position in an electrical or physical way. For instance, when the pulse width of the CCPP signal (3) in FIG. 10 is narrowed, the connection is changed so as to use the $\phi0$ signal in place of the $\phi2$ signal and the AND of $\phi0$ and $\phi6$ signals is calculated to achieve the reduced pulse width of approximately 17% of the clock cycle time.

Examples of the application of the present invention, include the generation of the internal timing pulses such as a writing pulse of a synchronous memory, an equalize pulse, a sense amplifier activation pulse and the like. When these pulses are set to adapt to the maximum speed operation, all the timing margins can be lightened in a low frequency operation and hence the operation of the LSIs can exactly be performed.

Further, the CELP signal shown by a waveform (4) in FIG. 10 is produced by using the signal picked up from the position $\phi7$ which is the previous stage of the position $\phi0$ from which the internal clock signal synchronous with the external signal is output and hence the timing of the CELP signal is determined so as to stride over the reference edge (leading edge in FIG. 10) of the external clock signal. The CELP signal (4) in FIG. 10 is generated at the timings of the $\phi7$ signal and the delayed $\phi0$ signal and thus its pulse width is from approximately 11% before the clock cycle of the leading edge of the reference clock signal to after the delay time of the delay circuit 4 of the clock edge. In this manner, the timing for striding over the reference edge is supplied to a circuit which is required to operate in only the periods before and after the reference edge, for example, a latch circuit for latching information at a timing of the reference edge of the clock signal or various signal amplifiers, with the result of reduction of the consumption current effectively.

FIG. 11 shows an amplifier using the phase lock loop timing generator according to the present invention. In FIG. 11, in a signal input buffer of a synchronous LSI, in order to capture the external signal into the LSI at the leading edge of the reference clock signal, the timing for striding over the clock edge, that is, the CELP signal (4) in FIG. 10 is used so as to permit a through current required for the operation to flow in only the limited periods before and after the clock edge, resulting in reducing the unnecessary current.

Although the AND of the $\phi0$ and $\phi7$ signals is calculated in the embodiment shown in FIG. 10, when the pulse width of the necessary timing pulse is at least 50% of the clock cycle, an OR of the two signals can be also used. However, an inversion of the AND leads to a similar result.

According to the present invention, an internal timing signal synchronous with an external clock cycle is generated without being affected by a production process or the like, and a design of an internal timing of LSIs can readily be carried out. Further, the LSIs can be prevented from their defective operation due to delicate timing mismatch.

While the present invention has been described with reference to the particular illustrative embodiments, it is not to be restricted by those embodiments but only by the appended claims. It is to be appreciated that those skilled in the art -can change or modify the embodiments without departing from the scope and spirit of the present invention.

What is claimed is:

1. A phase lock loop timing generator comprising:
   a phase comparator for comparing an external clock signal with an internal clock signal to detect a phase difference; and
   a voltage controlled oscillator (VCO) including a plurality of stages of inverters connected in series in a ring form, in which a frequency of the internal clock signal generated by the VCO is varied depending on the phase difference detected by the phase comparator, wherein one of logical AND and logical OR of signals picked up from a plurality of nodes of the inverters is calculated to output a timing signal proportional a to cycle of the external clock signal synchronous with a phase lock loop, wherein a fixed delay circuit is connected to an output of one of the nodes of the inverters for generating the timing signal to obtain a minimum time width of the timing signal.

2. A phase lock loop timing generator comprising:

a phase comparator for comparing an external clock signal with an internal clock signal to detect a phase difference; and a voltage controlled oscillator (VCO) including a plurality of stages of inverters connected in series in a ring form, in which a frequency of the internal clock signal generated by the VCO is varied depending on the phase difference detected by the phase comparator, wherein one of logical AND and logical OR of signals picked up from a plurality of nodes of the inverters is calculated to output a timing signal proportional to a cycle of the external clock signal synchronous with a phase lock loop, wherein a logic calculates either logical AND or logical OR of two signals, picked up from the nodes of the inverters, located in several stages either before or after an internal clock signal node, to output a timing for striding over a cyclic reference edge of the external clock signal.

3. The phase lock loop timing generator as claimed in claim 1, wherein a logic calculates either AND or OR of two signals, picked up from the nodes of the inverters, located in several stages either before or after an internal clock signal node, to output a timing for striding over a cyclic reference edge of the external clock signal.

4. A phase lock loop timing generator comprising;

a phase comparator for comparing an external clock signal with an internal clock signal to detect a phase difference; and a voltage controlled oscillator (VCO) including a plurality of stages of inverters connected in series in a ring form, in which a frequency of the internal clock signal generated by the VCO is varied depending on the phase difference detected by the phase comparator, wherein one of logical AND and logical OR of signals picked up from a plurality of nodes of the inverters is calculated to output a timing signal proportional to a cycle of the external clock signal synchronous with a phase lock loop, wherein buffers are connected to the nodes of the inverters so as to pick up the signals from the nodes via the buffers to equalize delay times of the inverters.

5. An amplifier, comprising:

a phase lock loop timing generator, including:

a phase comparator for comparing an external clock signal with an internal clock signal to detect a phase difference; and a voltage controlled oscillator (VCO) including a plurality of stages of inverters connected in series in a ring form, in which a frequency of the internal clock signal is varied depending on the phase difference detected by the phase comparator, wherein one of logical AND and logical OR of signals picked up from a plurality of nodes of the inverters is calculated to output a timing signal proportional to a cycle of the external clock signal synchronous with a phase lock loop, wherein a logic calculates either AND or OR of two signals, picked up from the nodes of the inverters, located in several stages either before or after an internal clock signal node, to output a timing for striding over a cyclic reference edge of the external clock signal, and wherein said phase lock loop timing generator is operable in only a period of the cyclic reference edge of the external clock signal.

6. An amplifier, as recited in claim 5, wherein said VCO includes a voltage-to-current converter coupled to each of the stages of inverters, said voltage-to-current converter receiving an input voltage and converting variations in the input voltage to first and second control currents which are respectively applied to first and second control inputs of said each of the stages of inverters in order to provide power currents for the VCO.

* * * * *